United States Patent
Forchel et al.

(10) Patent No.: US 6,671,306 B1
(45) Date of Patent: Dec. 30, 2003

(54) SEMICONDUCTOR LASER WITH A LATTICE STRUCTURE

(76) Inventors: Alfred Forchel, Abtsleitenweg 25a, D-97074, Wuerzburg (DE); Martin Kamp, Marienberg, D-97082, Wuerzburg (DE)

( * ) Notice: Subject to any disclaimer, the term of this patent is extended or adjusted under 35 U.S.C. 154(b) by 0 days.

(21) Appl. No.: 09/296,059

(22) Filed: Apr. 21, 1999

(30) Foreign Application Priority Data

Aug. 31, 1998 (DE) .................. 298 15 522 U

(51) Int. Cl.[7] .................................. H01S 5/22
(52) U.S. Cl. ............................................. 372/96
(58) Field of Search .................. 372/43–50, 96; 257/98; 438/22, 27, 29, 41

(56) References Cited

U.S. PATENT DOCUMENTS

| | | | |
|---|---|---|---|
| 4,805,184 A | * 2/1989 | Fiddyment et al. | 372/96 |
| 5,559,053 A | * 9/1996 | Choquette et al. | 437/129 |
| 5,563,902 A | * 10/1996 | Xu et al. | 372/50 |
| 5,982,804 A | * 11/1999 | Chen et al. | 372/96 |

OTHER PUBLICATIONS

Kamp et al., May 1998, High Performance laterally gain coupled InGaAs / AlGaAs DFB lasers.

Martin et al., Mar. 1995, CW Performance of an InGaAs–GaAs–AlGaAs Laterally–Coupled Distributed Feedback (LC–DFB) Ridge Laser Diode, IEEE Photonics Technology Letters.

Kamp et al., Jan. 25, 1999, "Low–threshold high–quantum–efficiency laterally gain–coupled InGaAs/AlGaAs distributed feedback lasers", Applied Physics Letters.

Legge et al., 2000, "Low threshold II–VI laser diodes with transversal and longitudinal single–mode emisssion", Journal of Crystal Growth.

Chen et al., 1997, "1.3–MUM wavelength INP laterally coupled distributed feedback ridge laser", Technical Digest.

* cited by examiner

*Primary Examiner*—Paul Ip
*Assistant Examiner*—Jeffrey Zahn
(74) *Attorney, Agent, or Firm*—McGlew and Tuttle, P.C.

(57) ABSTRACT

A semiconductor laser (22) with a semiconductor substrate (11), a laser layer (13) arranged on the semiconductor substrate, a waveguide ridge (15) arranged at a distance from the laser layer, and a strip-shaped lattice structure (23) arranged in parallel to the laser layer is disclosed. The lattice structure (23) includes two structural regions (24, 25) which are arranged on both sides of the waveguide ridge (15) and are formed at a distance from the laser layer (13) above the laser layer (13). A process for the production of such a semiconductor laser is also disclosed.

14 Claims, 4 Drawing Sheets

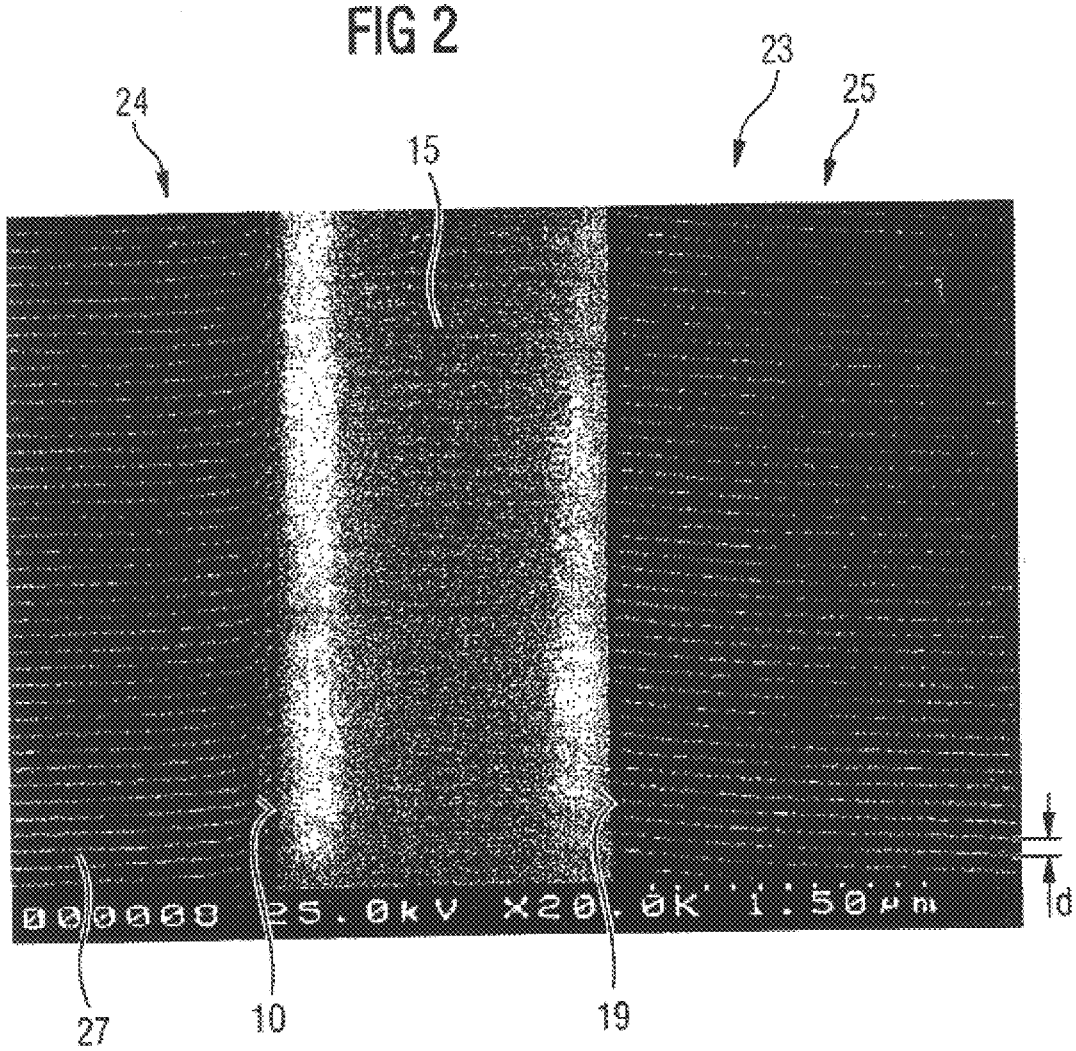

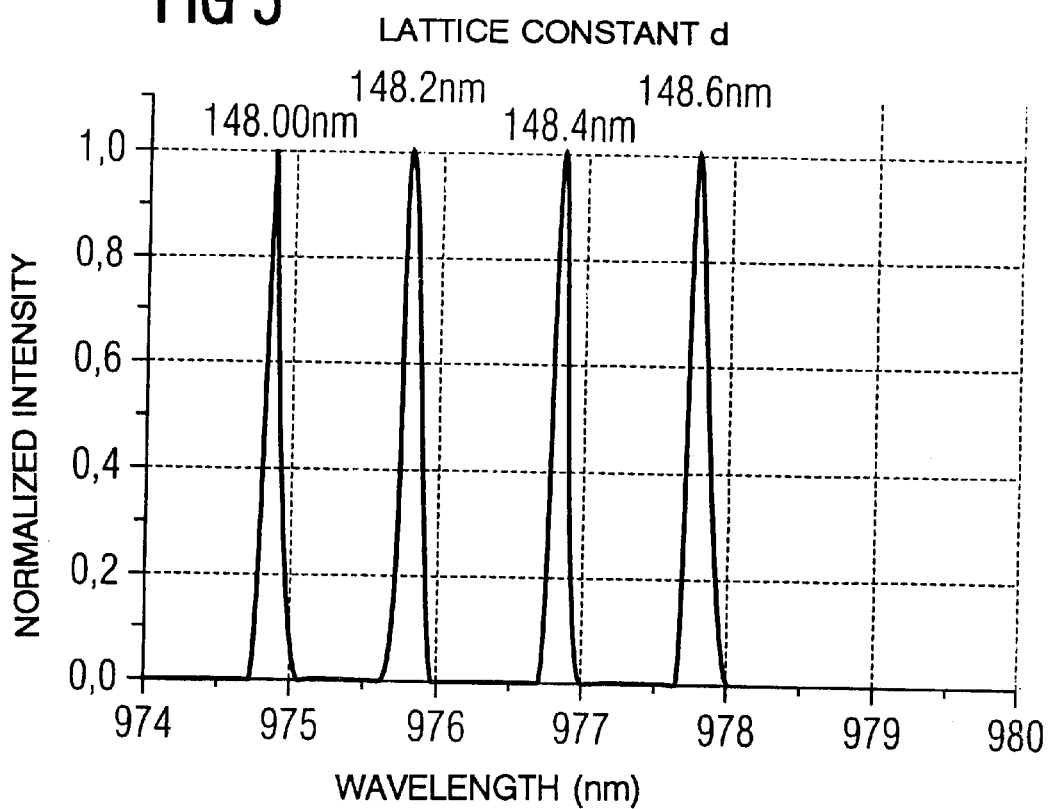

SEMICONDUCTOR LASER WITH A LATTICE STRUCTURE

FIELD OF THE INVENTION

The present invention relates to a semiconductor laser with a semiconductor substrate, a laser layer arranged on the semiconductor substrate, a waveguide ridge arranged at a distance from the laser layer, and a strip-shaped lattice structure arranged in parallel to the laser layer. The present invention further relates to a process for the production of such a semiconductor laser.

BACKGROUND OF THE INVENTION

Known semiconductor lasers of the type defined in the introduction, also referred to in the art as so-called DFB (distributed feedback) laser diodes, have a lattice structure which extends through the laser layer and which facilitates the construction of a monomode laser diode in which, in contrast to multi-mode laser diodes, laser radiation with one specified laser mode is emitted and other modes are suppressed by the lattice structure. The production of the DFB laser diodes constructed in the known manner proves extremely costly, in particular due to the production and test process employed and the high reject quota associated therewith. For the production of the known DFB laser diodes on the basis of a wafer on a semiconductor substrate base, epitaxy is used to form the structure of the semiconductor wafer on the semiconductor substrate. For the formation of the lattice structure in the laser layer, when approximately half the layer height of the epitaxial structure has been reached the epitaxial growth is interrupted and the lattice structure is introduced in a lithographic- and removal process. Then the epitaxial growth is continued. The interruption of the epitaxy in the formation of the laser layer and the following overgrowth of the lattice structure introduced into the half-layer induces defects in the laser layer which disadvantageously affect the properties of the laser layers and possibly manifest in a higher current consumption or a reduced life of the laser diodes.

As a result of the mutual influences between the laser layer and the lattice structure formed in the laser layer in terms of the amplification properties of the semiconductor laser wafer, the properties of a semiconductor laser wafer produced in the described way cannot be predetermined in an exact manner. As the properties of the semiconductor laser wafer cannot be determined until after the conclusion of the epitaxial growth and the complete formation of the laser layer in the test operation, the amplification spectrum of the semiconductor laser wafer also cannot be determined until after the formation of the lattice structure in the laser layer, with the result that the lattice structure cannot be accurately adapted to the amplification spectrum of the laser layers and consequently the known DFB laser diodes also cannot be produced in a precise manner in accordance with predefined specifications relating to the desired laser mode or the desired wavelength. Rather, the structure of the known DFB laser diodes described in the foregoing requires a production process in which different lattice structures must be formed in the laser layer of a semiconductor laser wafer in order that, by checking the laser diodes separated from the semiconductor laser wafer, precisely those laser diodes which emit the desired laser mode with the desired wavelength can be retrospectively determined. It is thus apparent that the structural design of the known DFB laser diodes necessitates the production of a plurality of laser diodes in order that the laser diodes suitable for the intended application, i.e. those laser diodes which emit a laser radiation with the desired wavelength, can be selected from this plurality of laser diodes by testing of their laser properties.

SUMMARY AND OBJECTS OF THE INVENTION

The primary object of the present invention is to propose a laser diode with a structure which facilitates a simple and reproducible manufacture of laser diodes with a defined wavelength. It is also an object of the present invention to propose a DFB laser diode with improved power output. A further object of the present invention is to propose a process particularly suitable for the production of a DFB laser diode according to the invention.

According to the invention, a semiconductor laser is provided with a semiconductor substrate. A laser layer is arranged on the semiconductor substrate. A waveguide ridge is arranged at a distance from the laser layer, and a strip-shaped lattice or grating structure is arranged in parallel to the laser layer. The lattice structure includes two structural regions which are arranged on both sides of the waveguide ridge and are formed at a distance from the laser layer above the laser layer.

An embodiment of the invention provides a DFB laser diode with a lattice structure produced following the conclusion of the epitaxial growth of the laser layer for completion of the semiconductor laser wafer and following the formation of the waveguide ridge. By virtue of this structurally required, subsequent production of the lattice structure it is possible to determine the individual amplification spectrum of the laser layer and semiconductor laser wafer before the production of the lattice structure in order then, by selective predefinitions of the parameters of the lattice structure, to be able to subsequently produce the desired laser profile in an exact manner and thus to be able to reproducibly manufacture DFB laser diodes with a precisely defined wavelength or laser mode.

The structural design according to the invention also facilitates an undisturbed, continuous formation of the laser layer in the epitaxial process so that unnecessary defects, which can impair the power output characteristic of the laser layer or the DFB laser diode, do not arise at all. The arrangement of the lattice structure at a distance from the active laser layer also prevents the subsequent impairment of the laser layer. The lattice structure modulates periodically the losses and the refractive power for light propagating through the laser. In this way the DFB laser diode according to the invention facilitates a complex coupling of the laser radiation with the lattice structure with lateral modulation of the real- and imaginary parts of the refractive index. Laser diodes according to the invention therefore have a high degree of insensitivity to back-reflections, which enables them to be used without an optical isolator, for example in applications for glass fiber transmission.

To permit the preciscest possible setting of the distance or relative position between the lattice structure and the active laser layer of the DFB laser diode in the production of the DFB laser diode, the lattice structure can be arranged on a barrier layer arranged in parallel to the laser layer.

If a metal, for example chromium, aluminum, scandium, titanium, vanadium, chromium, manganese, iron, cobalt, nickel, copper, zinc, yttrium, zirconium, niobium, molybdenum, ruthenium, rhodium, palladium, silver, cadmium, tin, hafnium, tantalum, tungsten, rhenium, osmium, iridium, platinum, gold, thallium, lead, bismuth, lanthanum, cerium, praseodymium, neodymium, promethium, samarium, europium, gadolinium, terbium, dysprosium, holmium, erbium, thulium, ytterbium, lutetium, and alloys thereof is used to form the lattice structure, the advantageous effects described in the foregoing can be achieved to a particularly comprehensive extent. Irrespectively of the material selected to construct the lattice structure, the lattice structure can also be formed by material removal, thus not only by material application.

It proves particularly advantageous for the structural regions of the lattice structure to be arranged adjacent to sides of the waveguide ridge and for the width of the waveguide ridge to be dimensioned such that base points of the sides are located in the peripheral region of the radiation emitted from the active zone of the laser layer. This ensures that the amplification power of the laser is influenced to the least extent possible by the lattice structure and in particular ensures effective coupling between the laser radiation and the lattice structure.

In order to improve the electrical injection the metallic lattice structure is placed on a thin insulator layer (e.g. native or artificial oxide). The insulator layer should be chosen in such a way that the refractive index is closer to that of the semiconductor and that the insulation is obtained a small thickness (typically a few nanometers). This layer is also used to suppress a potential penetration of the grating material into the semiconductor material of the laser layers and therefore serves as a barrier layer too.

For the optimization of the electrical injection surface and the effects of the lattice structure, it also proves advantageous for the sides of the waveguide ridge to be arranged substantially at right angles to the plane in which the lattice structure extends, within the accuracy attainable by the manufacturing process.

In a process according to the invention, on the basis of a semiconductor substrate a complete semiconductor laser structure is produced in an epitaxial process with the subsequent formation of a waveguide ridge by subjecting the semiconductor laser structure to a material removal process to form carrier surfaces arranged on both sides of the waveguide ridge and subsequent application of a lattice structure to the carrier surfaces.

Irrespectively of the material selected to form the lattice structure, the lattice structure can also be produced by material removal, thus not only by material application.

The processes according to the invention described in the foregoing thus facilitate the production of functional laser diodes in a first process phase, thereby facilitating the precise checking and determination of the electrical and optical properties, thus for example determination of the individual amplification spectrum of the semiconductor wafer used for the laser fabrication. Only thereafter in a second process phase, by the formation of lattice structures alongside the waveguide ridge with defined parameters, are the originally multi-mode laser diodes converted into monomode DFB laser diodes with properties in each case defined as a function of the parameters of the lattice structures.

In the event that the lattice structure is produced by the application of a lattice structure to the carrier surfaces, the use of a lithographic process, in particular the use of an electron beam lithographic process with subsequent metallization of the lithographic structure, proves particularly advantageous.

A variant of the production process which is particularly advantageous from the economic standpoint is possible if, for the production of a plurality of DFB laser diodes with different properties, a semiconductor laser wafer is firstly produced by applying an epitaxial structure to a semiconductor substrate, whereupon the waveguide ridges associated with the individual laser diodes are produced in the composite wafer by forming a strip-shaped waveguide structure which is arranged on the surface of the semiconductor laser wafer and which comprises waveguide ridges extending in parallel to one another and interlying carrier surfaces. Only thereafter is the semiconductor laser wafer divided up into separate semiconductor laser chip units, whereby the properties associated with the individual laser diodes are then precisely defined by the application or implantation of a lattice structure with corresponding structural parameters on the surface of a selected number of the laser diodes.

It is thus possible for the laser diodes which have been produced in the composite wafer and are already provided with the waveguide ridge to be used as basic laser diodes or "unfinished" laser diodes with defined electrical and optical properties whereupon, from this reservoir of identically formed basic laser diodes, the required number of laser diodes can then be selected and, by the application or implantation of defined lattice structures, the desired number of monomode DFB laser diodes with precisely defined optical and electrical properties can be produced substantially without rejects.

In the following the construction of an embodiment of a DFB laser diode according to the invention and a possible process for the production thereof will be explained in detail making reference to the drawing.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 2 is a scanning electron microscope image of a plan view of the lattice structure arranged on both sides of a waveguide;

FIG. 5 is a graphic representation of the dependence between the amplification spectrum or wavelength of the radiation emitted from the laser diode and the lattice constant of the lattice structure;

DESCRIPTION OF THE PREFERRED EMBODIMENTS

Figure 1A:
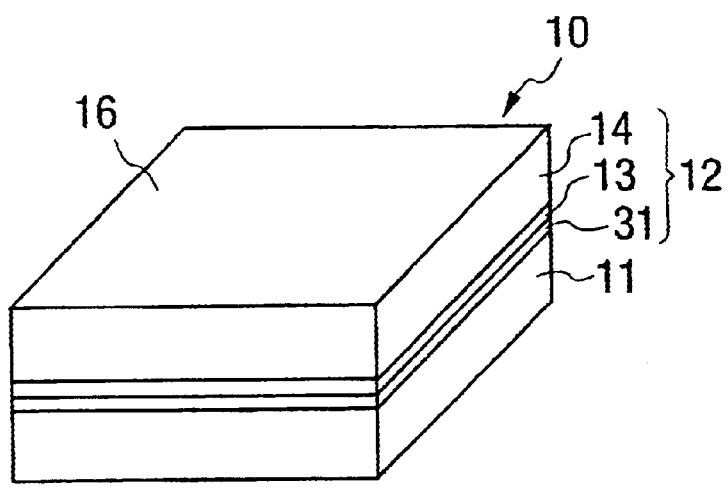
FIG. 1a is a view illustrating a stage in the production of a DFB laser diode with a lateral lattice structure.

Referring to the drawings in particular, FIG. 1a is a simplified perspective view of a semiconductor laser or basic laser diode 10 comprising a semiconductor substrate 11 and an epitaxial structure 12 grown thereon. Part of the epitaxial structure 12 is formed by a laser layer 13 based on a buffer and contact layer 31 and covered at the top by a covering layer 14.

Figure 1B:
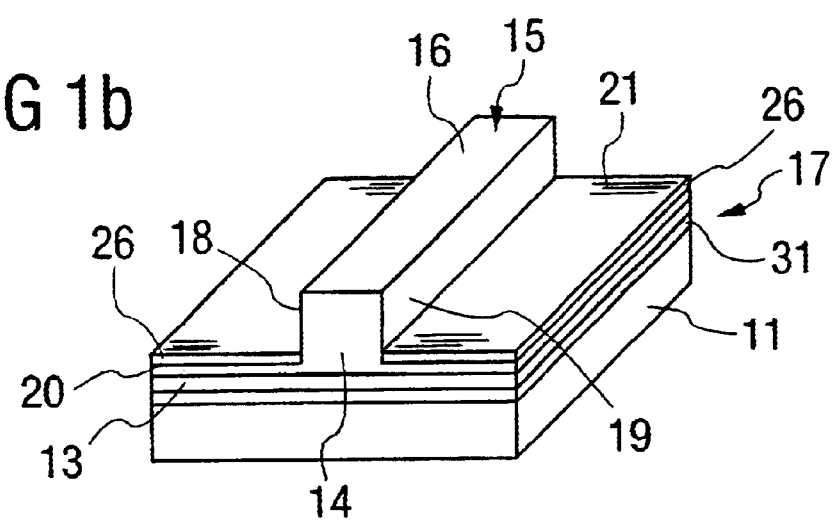
FIG. 1b is a view illustrating a different stage in the production of a DFB laser diode with a lateral lattice structure.
Figure 1C:
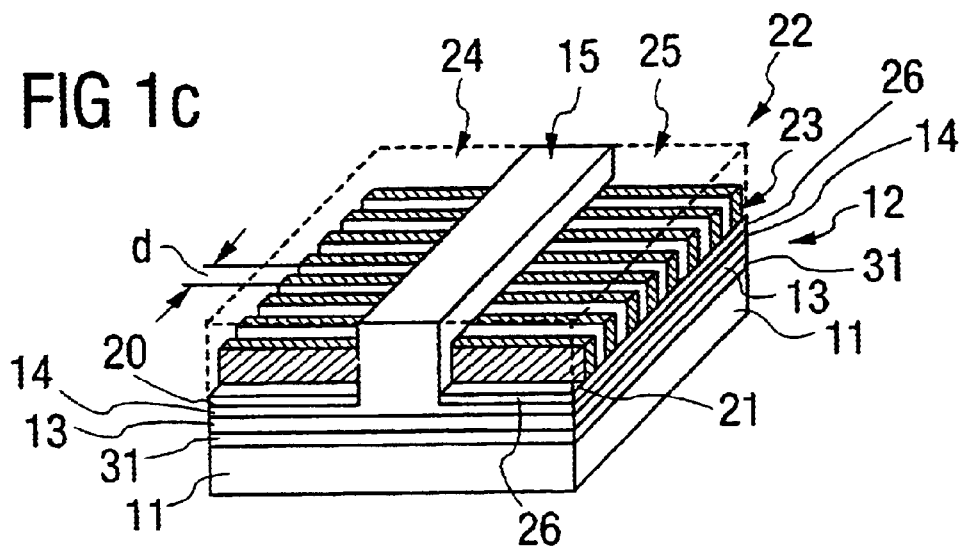
FIG. 1c is a view illustrating a different stage in the production of a DFB laser diode with a lateral lattice structure.

The basic laser diode 10 shown in FIG. 1a is of cuboid formation with a flat diode surface 16. Commencing from the basic laser diode 10 illustrated in FIG. 1a, the embodiment of a DFB laser diode 22 according to the invention shown in FIG. 1c is produced in two essential process phases; as a transitional stage following the implementation of a first process phase, FIG. 1b shows a waveguide diode 17 in which the diode surface 16 has been subjected to a material removal process, such as for example a dry etching process, in order to obtain the illustrated stepped surface formation with a waveguide ridge 15 extending in the longitudinal direction of the waveguide diode 17. The aforementioned material removal process gives rise to surfaces which are formed on both sides of sides 18, 19 of the waveguide ridge 15 and which will be referred to in the following as carrier surfaces 20 and 21, the carrier surfaces being covered by a thin insulating layer 26.

Commencing from the waveguide diode 17 illustrated in FIG. 1b, the embodiment of a DFB laser diode 22 shown in FIG. 1c is produced by forming a metallic lattice structure 23 with two structural regions 24 and 25 in each case arranged in the carrier surfaces 20 and 21 respectively by subjecting the carrier surfaces 20 and 21 to an electron beam lithographic process and a following metallization process not described in detail here. This second process phase results in the DFB laser diode 22 illustrated in FIG. 1c with the metallic lattice structure 23 arranged in the carrier surfaces 20 and 21 above the laser layer 13. To be able to precisely define the position of the structural regions 24 and 25 of the metallic lattice structure 23 arranged on both sides of the waveguide ridge 15 in the epitaxial structure 12 relative to the laser later 13, the insulating layer 26, for example in the form of an etch-stop layer, is provided in the epitaxial structure above the laser layer 13, which insulating layer 26 limits the depth, in the epitaxial structure 12, of a lithographic structure produced using an etching process and therby defines the position of the metallic lattice structure 23 relative to the laser layer 13.

As shown by the electron microscope image of a plan view of the metallic lattice structure 23 schematically illustrated in FIG. 1c, the structural regions 24 and 25 constructed from lattice ridges 27, here arranged equidistantly from one another, extend up to the sides 18 and 19 of the waveguide 15. The characteristic of the metallic lattice structure 23 is determined by the distance between the lattice ridges 27 or the lattice constant d, the geometric configuration of the lattice ridges 27, and the metal used for the metallic lattice structure 23.

Figure 3:
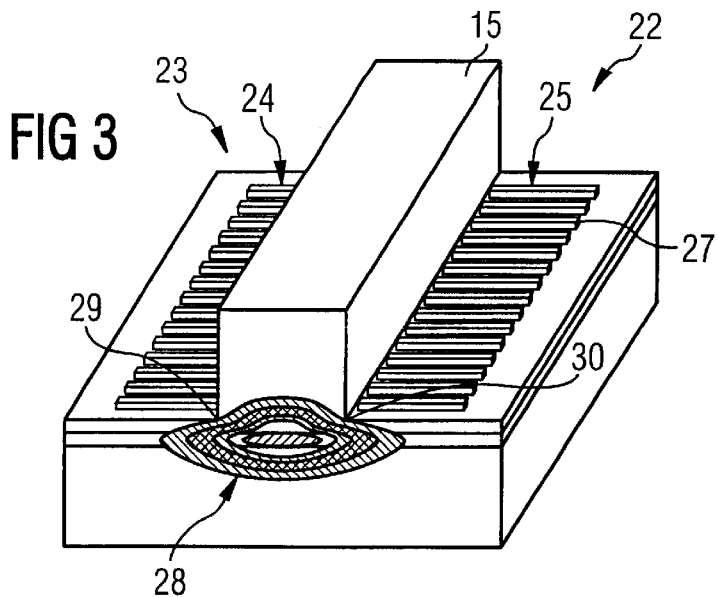
FIG. 3 is a simplified perspective view of a laser diode illustrating the active zone of a laser layer.

FIG. 3 is a qualitative illustration of the active zone 28 of the laser layer 13 in the form of an intensity distribution depicted in the outlet cross-section of the laser diode 22. It will be apparent that, since the individual lattice ridges 27 are connected as directly as possible to the sides 18, 19, in particular in the region of base points 29, 30 of the sides 18, 19 a coupling is advantageously achieved between the metallic lattice structure 23 and the laser radiation in its peripheral zone.

Figure 4:
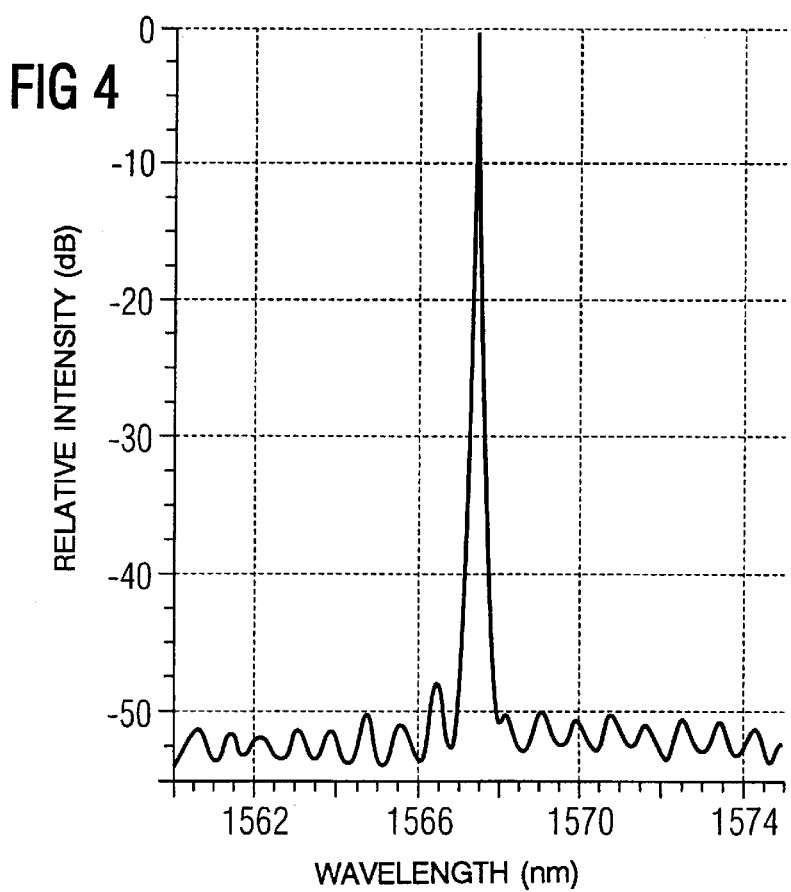
FIG. 4 is a diagram illustrating a possible amplification spectrum of the laser diode shown in FIG. 3.

FIG. 4 clarifies the filter effect obtained by means of the metallic lattice structure 23 in that, as can be seen from FIG. 4, subsidiary modes of the laser radiation emitted from the active zone 28 are effectively suppressed and substantially only the emission of one laser mode with a precisely defined wavelength is permitted.

FIG. 5 illustrates the effects of changes in the lattice constant d (FIG. 1c) upon the wavelength. It will be apparent from FIG. 5 that by changing the lattice constant d it is possible to achieve a highly accurate fine adjustment of the wavelength so that, commencing from a predetermined individual amplification spectrum of a basic laser diode 10 illustrated by way of example in FIG. 1a, by purposively selecting the parameters of the lattice structure, thus for example the lattice constant, a highly accurate setting of the wavelength can be obtained for the intended application of the laser diode in question. For example, by means of the choice of metal for the metallic lattice structure 23, the complex coupling between the laser radiation and the lattice structure, thus for example the absolute value and the relative ratio of the real- and imaginary parts of the refractive index—and thus the component of refractive index coupling and absorption coupling—can be set within wide limits. The so-called "duty factor" of the lattice structure, thus the ratio of the lattice ridge width to the lattice constant, also constitutes a variable which can be optimized.

While specific embodiments of the invention have been shown and described in detail to illustrate the application of the principles of the invention, it will be understood that the invention may be embodied otherwise without departing from such principles.

What is claimed is:

1. A semiconductor laser, comprising:
   a semiconductor substrate;
   a laser layer arranged on said semiconductor substrate;
   a covering layer mounted on said laser layer, said covering including a waveguide ridge arranged at a distance from said laser layer, whereby vertical injection is achieved; and
   a strip-shaped lattice structure arranged in parallel to the laser layer, said lattice structure comprising two structural regions which are respectively arranged on sides of said waveguide ridge and are formed at a distance from said laser layer above said laser layer, each of said structural regions being formed of metal to form a metallic lattice structure, wherein said lattice structure is arranged on an insulating layer which defines a position of said lattice structure relative to said laser layer.

2. The semiconductor laser according to claim 1, wherein said metal is chromium or a chromium alloy.

3. The semiconductor laser according to claim 1, wherein structural regions of said lattice structure are arranged adjacent to sides of said waveguide ridge and a width of said waveguide ridge is dimensioned such that base points of sides of said waveguide ridge are located in a peripheral region of radiation emitted from an active zone of said laser layer.

4. The semiconductor laser according to claim 1, wherein said waveguide ridge has sides arranged substantially at right angles to a plane in which said lattice structure extends.

5. The semiconductor laser according to claim 1, wherein said waveguide ridge has sides arranged substantially at right angles to a plane in which said lattice structure extends.

6. A semiconductor laser, comprising:
   a semiconductor substrate;
   a laser layer arranged on said semiconductor substrate;
   a covering layer mounted on said laser layer, said covering including a waveguide ridge arranged at a distance from said laser layer, whereby vertical injection is achieved;
   an insulating layer;

a strip-shaped lattice structure arranged in parallel to the laser layer, said lattice structure comprising a first structural region arranged on one side of said waveguide ridge and a second structural region arranged on another side of said waveguide ridge with said waveguide ridge separating said first structural region and said second structural region, said insulating layer being disposed between said first structural region and said laser layer formed at a distance from said laser layer above said laser layer to define a position of said first structural region relative to said laser layer and said insulating layer being disposed between said second structural region and said laser layer formed at a distance from said laser layer above said laser layer to define a position of said lattice structure relative to said laser layer, each of said first structural region and said second structural region consisting of metal to provide a metallic lattice structure.

7. A semiconductor laser according to claim 6, wherein said metal is chromium or a chromium alloy.

8. A semiconductor laser according to claim 6, wherein structural regions of said lattice structure are arranged adjacent to sides of said waveguide ridge and a width of said waveguide ridge is dimensioned such that base points of sides of said waveguide ridge are located in a peripheral region of radiation emitted from an active zone of said laser layer.

9. A semiconductor laser according to claim 6, wherein said waveguide ridge has sides arranged substantially at right angles to a plane in which said lattice structure extends.

10. A semiconductor laser, comprising:

a semiconductor substrate, a laser layer arranged on said semiconductor substrate;

a contact layer arranged between said laser layer and said semiconductor substrate, said contact layer providing vertical injection to said laser layer;

a covering layer mounted on said laser layer, said covering including a waveguide ridge arranged at a distance from said laser layer;

an insulating layer;

a poly-crystalline metallic lattice structure arranged in parallel to the laser layer, said lattice structure comprising a first structural region arranged on one side of said waveguide ridge and a second structural region arranged on another side of said waveguide ridge, said insulating layer being disposed between said first structural region and said laser layer formed at a distance from said laser layer above said laser layer to define a position of said first structural region relative to said laser layer and said insulating layer being disposed between said second structural region and said laser layer formed at a distance from said laser layer above said laser layer to define a position of said lattice structure relative to said laser layer, each of said first structural region and said second structural region including metallic strips, with adjacent strips separated by regions with a lower metal content or with no metal to provide a ratio of the real and imaginary parts of a refractive index and to provide for a selection of laser light wavelength.

11. The semiconductor laser according to claim 10, wherein said metallic strips are made of chromium or a chromium alloy.

12. The semiconductor laser according to claim 10, wherein structural regions of said lattice structure are arranged adjacent to sides of said waveguide ridge with said waveguide ridge separating said first structural region and said second structural region and a width of said waveguide ridge is dimensioned such that base points of sides of said waveguide ridge are located in a peripheral region of radiation emitted from an active zone of said laser layer.

13. The semiconductor laser according to claim 10, wherein said wave guide ridge has sides arranged substantially at right angles to a plane in which said lattice structure extends.

14. The semiconductor laser according to claim 10, wherein the distance between adjacent strips is set to select laser light wavelength.

* * * * *